United States Patent
Chen (10) Patent No.: US 9,589,942 B2
(45) Date of Patent: Mar. 7, 2017

(54) PACKAGE STRUCTURE AND MANUFACTURING METHOD THEREOF

(71) Applicant: Subtron Technology Co., Ltd., Hsinchu County (TW)

(72) Inventor: Chien-Ming Chen, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 14/673,883

(22) Filed: Mar. 31, 2015

(65) Prior Publication Data

US 2016/0163614 A1 Jun. 9, 2016

(30) Foreign Application Priority Data

Dec. 8, 2014 (TW) .............................. 103142586 A (51) Int. Cl.
*H01L 23/48* (2006.01)
*H01L 25/16* (2006.01)
(Continued)

(52) U.S. Cl.
CPC .......... *H01L 25/16* (2013.01); *H01L 21/4803* (2013.01); *H01L 21/4846* (2013.01);
(Continued)

(58) Field of Classification Search
USPC .......................... 257/774, 678, 686, E23.001
See application file for complete search history.

(56) References Cited

U.S. PATENT DOCUMENTS

| 6,506,632 B1 | 1/2003 | Cheng et al. |
| 2010/0072588 A1 | 3/2010 | Yang |
| 2011/0068468 A1* | 3/2011 | Lin .................. H01L 23/49816 257/737 |

FOREIGN PATENT DOCUMENTS

| JP | 2008235624 | 10/2008 |
| JP | 2008277568 | 11/2008 |

(Continued)

OTHER PUBLICATIONS

"Office Action of Taiwan Counterpart Application", issued on Jun. 24, 2015, p. 1-16, in which the listed references were cited.
"Office Action of Japan Counterpart Application", issued on May 24, 2016, p. 1-7, in which the listed references were cited.

*Primary Examiner* — Timor Karimy
(74) *Attorney, Agent, or Firm* — Jianq Chyun IP Office (57) ABSTRACT

A package structure includes a first substrate, a patterned solder mask, first thermal-conductive posts, a chip and a second substrate. The first substrate includes a first patterned metal layer, a second patterned metal layer, a first surface and a second surface. The first and second patterned metal layers are disposed on the first and second surfaces. The patterned solder mask disposed on the first and second patterned metal layers exposes part of the first and second patterned metal layers. The first thermal-conductive posts are disposed on the exposed first patterned metal layer and thermally coupled thereto. The chip is disposed on the first surface. The chip electrically connected to the first patterned metal layer is thermally coupled to the first thermal-conductive posts. Two opposite ends of each first thermal-conductive post are connected to the first and second substrates, and the first thermal-conductive posts are thermally coupled to the second substrate.

13 Claims, 6 Drawing Sheets (51) Int. Cl.
*H01L 25/00* (2006.01)
*H01L 21/48* (2006.01)
*H01L 25/065* (2006.01)
*H01L 23/31* (2006.01)
*H01L 23/367* (2006.01)
*H01L 23/538* (2006.01)
*H01L 23/00* (2006.01)
*H01L 21/56* (2006.01)

(52) U.S. Cl.
CPC ...... *H01L 23/3121* (2013.01); *H01L 23/3677* (2013.01); *H01L 23/5383* (2013.01); *H01L 23/5384* (2013.01); *H01L 23/5389* (2013.01); *H01L 24/19* (2013.01); *H01L 24/20* (2013.01); *H01L 25/0657* (2013.01); *H01L 25/50* (2013.01); *H01L 21/568* (2013.01); *H01L 2224/04105* (2013.01); *H01L 2224/12105* (2013.01); *H01L 2224/16225* (2013.01); *H01L 2224/16237* (2013.01); *H01L 2225/06517* (2013.01); *H01L 2225/06572* (2013.01); *H01L 2225/06589* (2013.01); *H01L 2924/19105* (2013.01); *H01L 2924/19106* (2013.01)

(56) References Cited

FOREIGN PATENT DOCUMENTS

| | | |
|---|---|---|
| JP | 2010245157 | 10/2010 |
| JP | 2014103382 | 6/2014 |
| TW | 424308 | 3/2001 |
| TW | I241007 | 10/2005 |
| TW | I245338 | 12/2005 |
| TW | I249231 | 2/2006 |
| TW | I260079 | 8/2006 |
| TW | I282160 | 6/2007 |
| TW | I290812 | 12/2007 |
| TW | I324029 | 4/2010 |
| TW | 201225761 | 6/2012 |
| TW | 201227884 | 7/2012 |
| TW | 201230273 | 7/2012 |
| TW | 201251527 | 12/2012 |
| TW | 201304091 | 1/2013 |
| TW | I411073 | 10/2013 |
| TW | I413223 | 10/2013 |

* cited by examiner

PACKAGE STRUCTURE AND MANUFACTURING METHOD THEREOF

CROSS-REFERENCE TO RELATED APPLICATION

This application claims the priority benefit of Taiwan application serial no. 103142586, filed on Dec. 8, 2014. The entirety of the above-mentioned patent application is hereby incorporated by reference herein and made a part of this specification.

BACKGROUND OF THE INVENTION

Field of the Invention

The present invention generally relates to a package structure and manufacturing method thereof. More particularly, the present invention relates to a package structure having rather thin overall thickness and manufacturing method thereof.

Description of Related Art

In recent years, electronic devices are frequently installed in a circuit board for improving electrical properties of the electronic devices, which is known as a system-in-package (SIP) structure. The SIP structure is referred to as a system integration package. Namely, the electronic devices are integrated into a single package in which passive devices, memories, electronic connectors, and other embedded devices are included. A variety of manufacturing methods can be applied to the SIP structure made of various materials. After the electronic devices are configured within the circuit board, conductive layers are stacked on the circuit board by applying a build-up method, so as to assemble the circuit board that has multiple layers.

Nevertheless, the SIP structure has a relatively complicated structure notwithstanding the fact that the SIP structure can effectively reduce package area and initially integrate the system. Moreover, in comparison with a single chip package, the SIP structure encounters more challenges with respect to its design for heat dissipation and maintenance of electrical reliability. Since the embedded devices are embedded in the multi-layer circuit board, the heat generated by the embedded devices is required to be dissipated out of the circuit board by means of a metal conductive layer and an insulating layer. As such, heat dissipation blocks are generally disposed on an outer circuit layer of a conventional package structure containing embedded devices. However, the disposition of heat dissipation blocks would increase the overall thickness of the package structure which deteriorates miniaturization of the package structure.

SUMMARY OF THE INVENTION

Accordingly, the present invention is directed to a package structure, wherein the overall thickness thereof is rather thin.

The present invention is directed to a manufacturing method of a package structure for manufacturing the package structure described above.

The present invention provides a manufacturing method of a package structure. The method includes the following steps. Firstly, a first substrate is provided. The first substrate includes a first surface, a second surface opposite to the first surface, a first metal layer and a second metal layer, wherein the first metal layer and the second metal layer are respectively disposed on the first surface and the second surface. Then, a patterning process is performed on the first metal layer and the second metal layer to form a first patterned metal layer and a second patterned metal layer. Next, a patterned solder mask is formed on the first patterned metal layer and the second patterned metal layer, and the patterned solder mask exposes at least a part of the first patterned metal layer and the second patterned metal layer. Then, a plurality of first thermal-conductive posts is formed on the exposed first patterned metal layer, and each of the first thermal-conductive posts thermally coupled to the first patterned metal layer. Next, a first semiconductor component is disposed on the first surface, and the first semiconductor component electrically connected to the first patterned metal layer and thermally coupled to the first thermal-conductive posts. Then, a second substrate is disposed on the first substrate through the first thermal-conductive posts, wherein two opposite ends of each first thermal-conductive post are connected to the first substrate and the second substrate respectively, such that the first semiconductor component is located between the first substrate and the second substrate, and the first thermal-conductive posts are thermally coupled to the second substrate.

The present invention further provides a package structure including a first substrate, a patterned solder mask, a plurality of first thermal-conductive posts, a first semiconductor component and a second substrate. The first substrate includes a first surface, a second surface opposite to the first surface, a first patterned metal layer and a second patterned metal layer, wherein the first patterned metal layer and the second patterned metal layer are disposed on the first surface and the second surface respectively. The patterned solder mask is disposed on the first patterned metal layer and the second patterned metal layer and exposes at least a part of the first patterned metal layer and the second patterned metal layer. The first thermal-conductive posts are disposed on the exposed part of the first patterned metal layer and thermally coupled to the first patterned metal layer. The first semiconductor component is disposed on the first surface and electrically connects the first patterned metal layer and thermally coupled to the first thermal-conductive posts. Two opposite ends of each of the first thermal-conductive posts are connected to the first substrate and the second substrate respectively, such that the first semiconductor component is located between the first substrate and the second substrate and the first thermal-conductive posts are thermally coupled to the second substrate.

According to an embodiment of the present invention, the manufacturing method of the package structure further includes the following steps. First, a plurality of second thermal-conductive posts are formed on the exposed second patterned metal layer and each of the second thermal-conductive posts are thermally coupled to the second patterned metal layer. Next, a second semiconductor component is disposed on the second surface and electrically connected to the second patterned metal layer and thermally coupled to the second thermal-conductive posts. Then, a third substrate is disposed on the first substrate through the second thermal-conductive posts, wherein two opposite ends of each second thermal-conductive post are connected to the first substrate and the third substrate respectively, and the second thermal-conductive posts are thermally coupled to the third substrate.

According to an embodiment of the present invention, the step of providing the first substrate includes the following steps. First, a core layer is formed. The core layer includes a third metal layer and a fourth metal layer, and the third metal layer and the fourth metal layer cover two opposite surfaces of the core layer respectively. Then, a patterning process is performed on the third metal layer and the fourth metal layer to form a third patterned metal layer and a fourth patterned metal layer. Next, a cavity penetrating the core layer is formed. Then, the core layer is disposed on a tape carrier, and the cavity exposes a part of the tape carrier. Next, at least one third semiconductor component is disposed on the part of the tape carrier exposed by the cavity, so that the third semiconductor component is located in the cavity. Then, a first stacked layer is laminated on the core layer along a direction toward the third patterned metal layer. The first stacked layer includes a first dielectric layer and the first metal layer, and the first dielectric layer covers at least a part of the third semiconductor component. The tape carrier is removed. A second stacked layer is laminated on the core layer along a direction toward the fourth patterned metal layer. The second stacked layer includes a second dielectric layer and the second metal layer. The first dielectric layer and the second dielectric layer jointly encapsulate the third semiconductor component. Then, multiple component conducting vias are formed. The component conducting vias are electrically connected to the third semiconductor component to the first metal layer or the second metal layer.

According to an embodiment of the present invention, the step of providing the first substrate further includes the following steps. First, a first through hole penetrating the core layer is formed. Then, a first conductive layer is formed, and the first conductive layer covers an inner wall of the first through hole and connects the third metal layer and the fourth metal layer.

According to an embodiment of the present invention, the first dielectric layer and the second dielectric layer are filled in the first through hole.

According to an embodiment of the present invention, the step of providing the first substrate further includes forming a plurality of first conductive vias for electrically connecting the first conductive layer to the first metal layer and the second metal layer.

According to an embodiment of the present invention, the step of providing the first substrate further includes forming a second through hole penetrating the core layer, and forming a second conductive layer, wherein the second conductive layer comprehensively fills the second through hole and connects the third metal layer and the fourth metal layer.

According to an embodiment of the present invention, the step of providing the first substrate further includes forming a plurality of second conductive vias for electrically connecting the second conductive layer to the first metal layer and the second metal layer.

According to an embodiment of the present invention, the step of providing the first substrate further includes forming a third through hole penetrating the core layer, forming a third conductive layer, wherein the third conductive layer covers an inner wall of the third through hole and connects the third metal layer and the fourth metal layer, and filling a plugging ink into the third through hole.

According to an embodiment of the present invention, the step of providing the first substrate further includes forming a plurality of third conductive vias for electrically connecting the third conductive layer to the first metal layer and the second metal layer.

According to an embodiment of the present invention, the step of providing the first substrate further includes forming a fourth through hole penetrating the first stacked layer and the second stacked layer, forming a fourth conductive layer, wherein the fourth conductive layer covers an inner wall of the fourth through hole and connects the first metal layer and the second metal layer, and filling a plugging ink into the fourth through hole.

According to an embodiment of the present invention, the manufacturing method of the package structure further includes the following steps. First, a surface finish layer is formed on the first patterned metal layer and the second patterned metal layer. The surface finish layer covers the part of the first patterned metal layer and the second patterned metal layer exposed by the patterned solder mask.

According to an embodiment of the present invention, the surface finish layer includes organic solderability preservatives (OSP) layer, electroless nickel and immersion gold (ENIG) layer, immersion silver (I-Ag) layer, immersion tin (I-Sn) layer, immersion bismuth (I-Bi) layer, hot air solder levelling (HASL) layer, nickel and gold electroplating layer, electroless Pd/Ni layer, electroless Pd/Cu layer or SnBi layer.

Based on the above-mentioned description, the present invention adopts a plurality of thermal-conductive posts to connect the first substrate and the second substrate. As such, the thermal-conductive posts can facilitate the heat dissipation of the semiconductor component embedded in the first substrate. Moreover, another semiconductor component which conventionally should be stacked on the first substrate can now be disposed in the space between the first substrate and the second substrate defined by the thermal-conductive posts, so as to improve space utilization of a package structure, and further reduce the overall thickness of the package structure.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
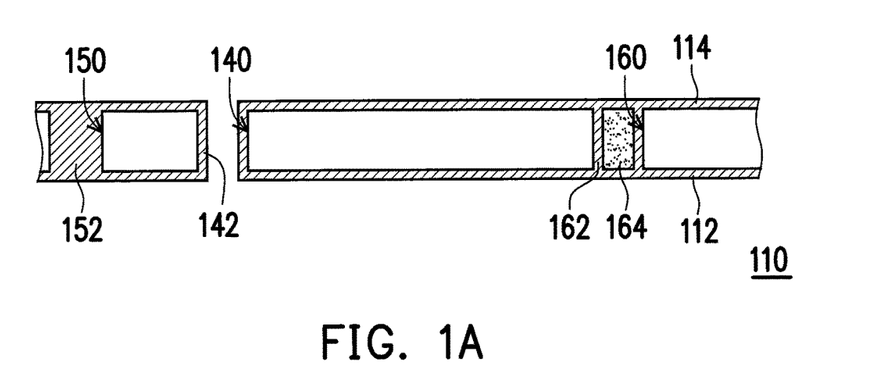
FIG. 1A to FIG. 1P illustrate a manufacturing process of a package structure according to an embodiment of the invention.
Figure 1B:
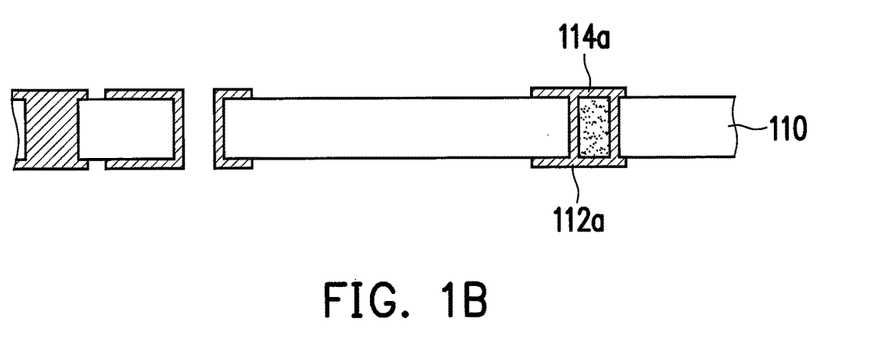
Figure 1C:
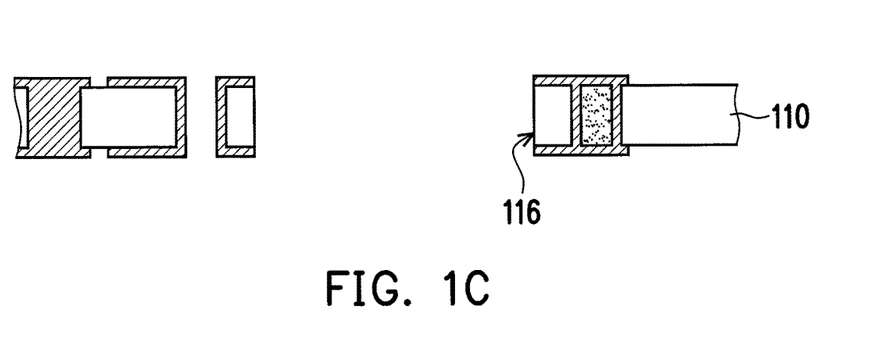
Figure 1D:
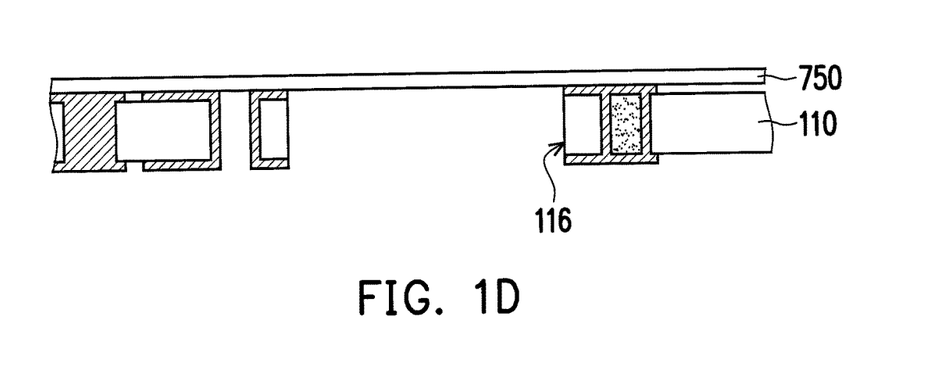
Figure 1E:
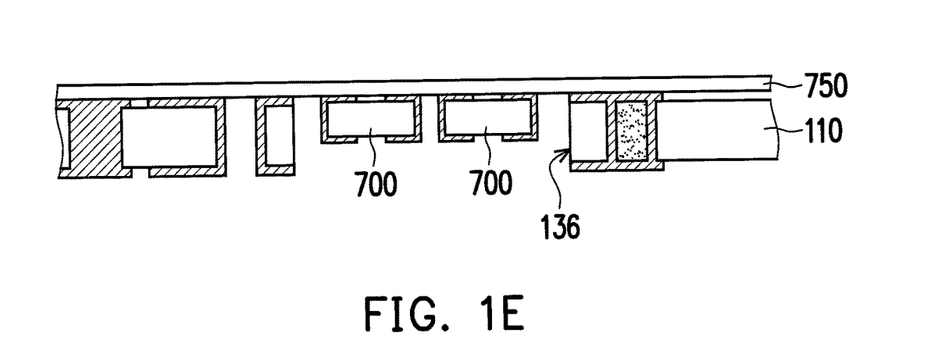
Figure 1F:
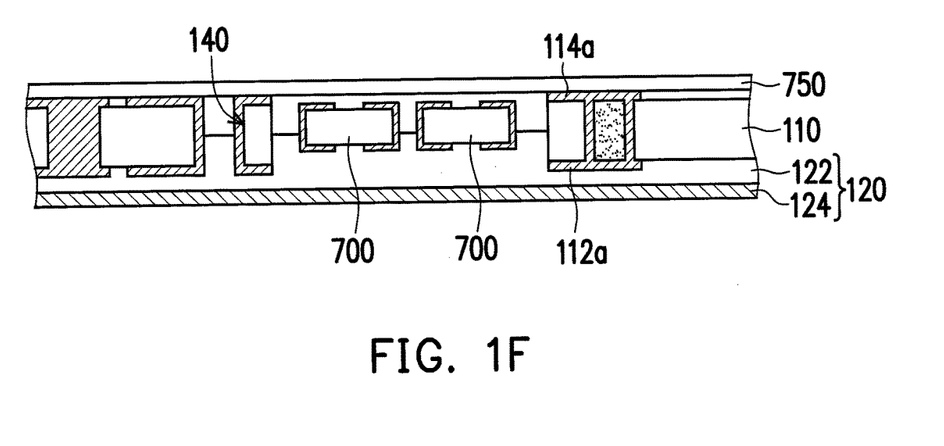
Figure 1G:
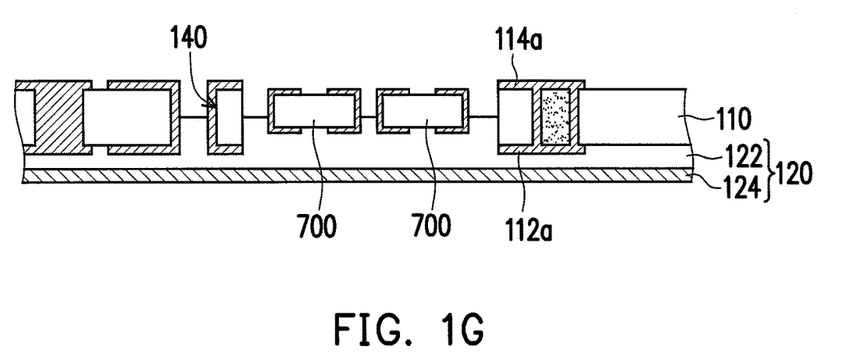
Figure 1H:
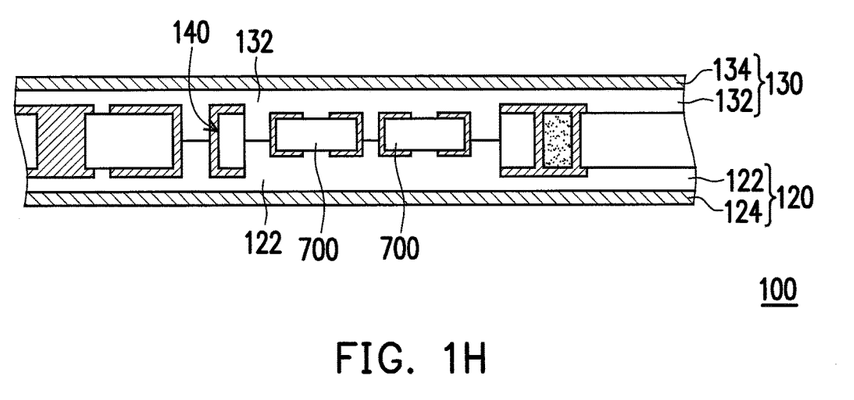
Figure 1I:
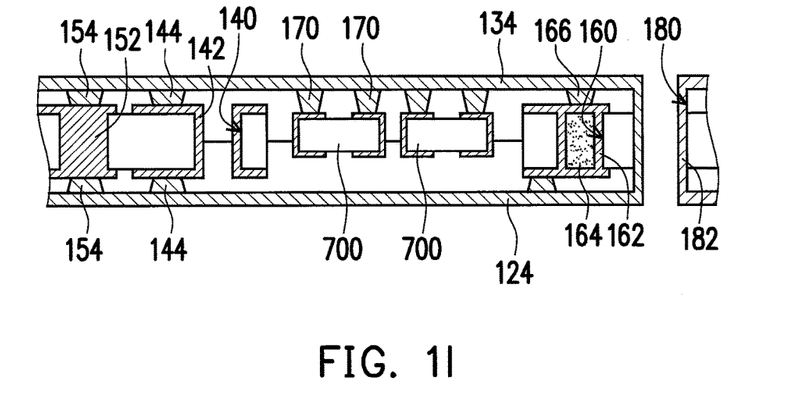
Figure 1J:
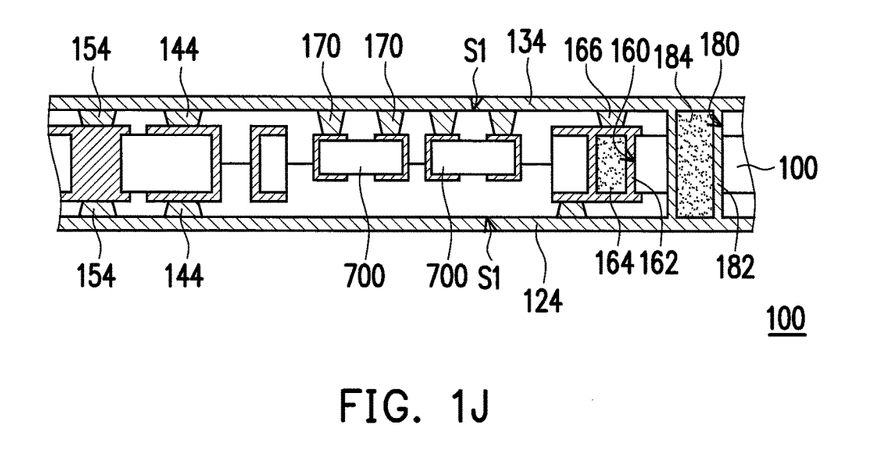
Figure 1K:
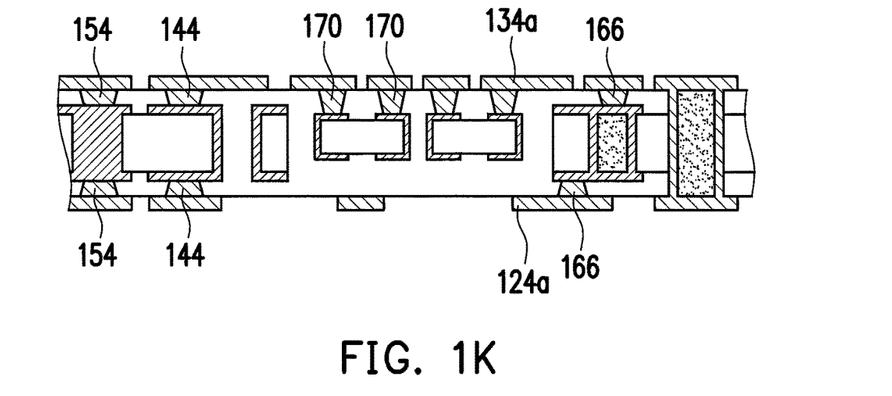
Figure 1L:
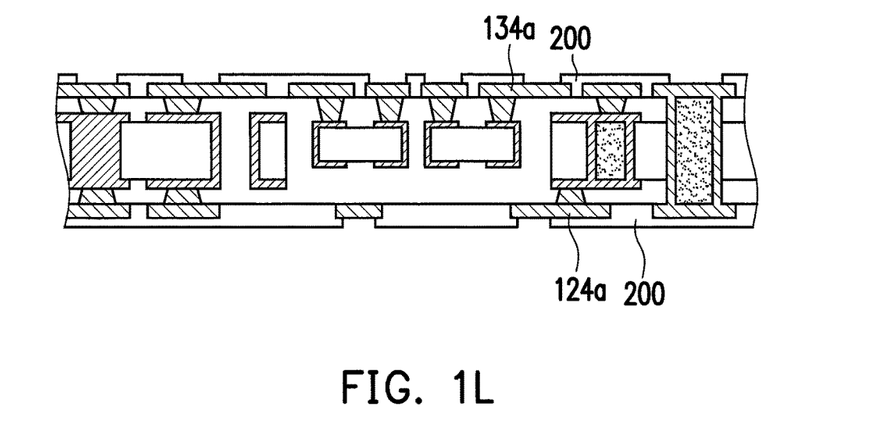
Figure 1M:
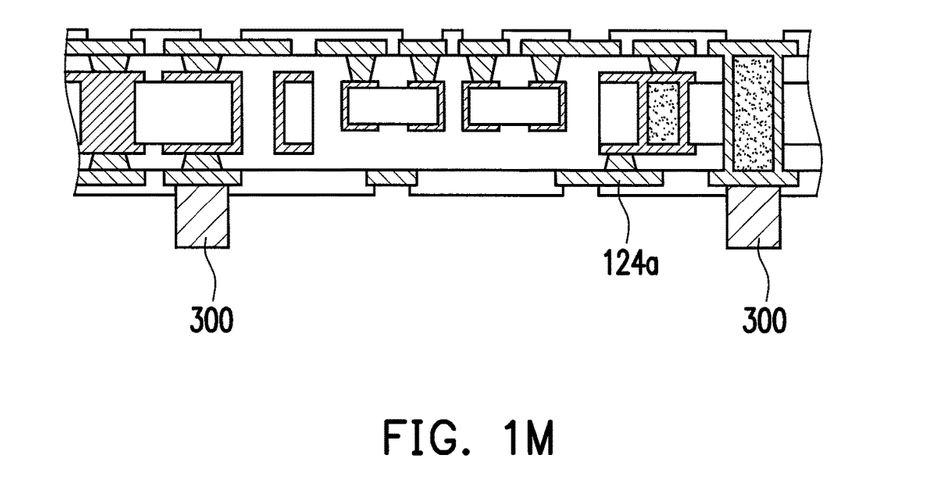
Figure 1N:
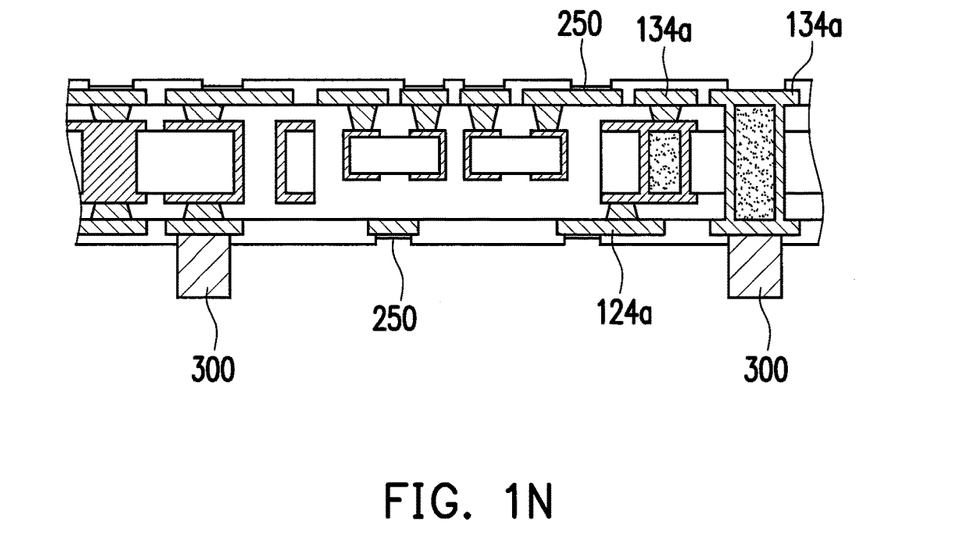
Figure 1O:
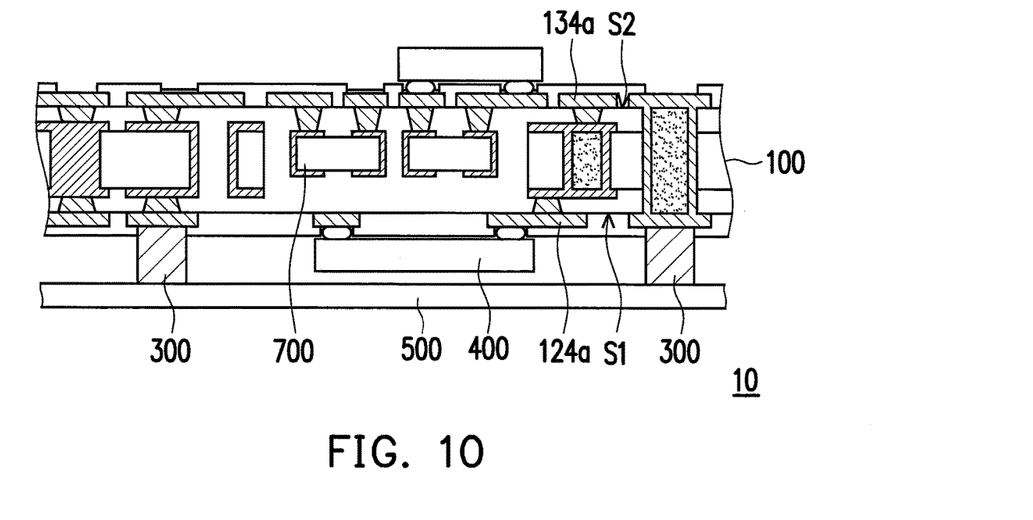
Figure 1P:
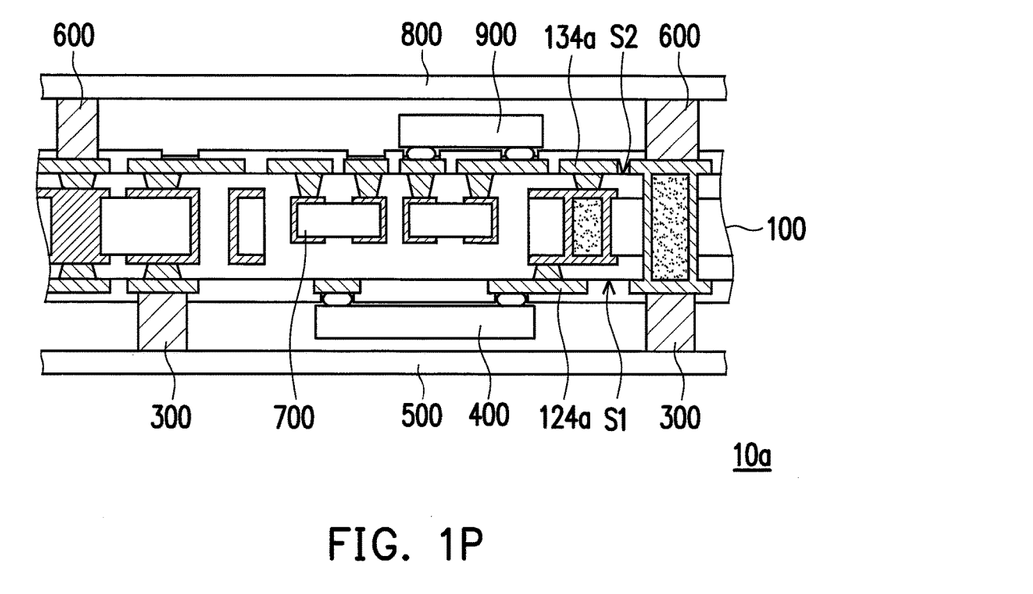

FIG. 1A to FIG. 1P illustrate a manufacturing process of a package structure according to an embodiment of the invention. In the present embodiment, the manufacturing method of the package structure includes the following steps. Firstly, a core layer 110 as shown in FIG. 1A is formed, wherein the core layer 110 includes a third metal layer 112 and a fourth metal layer 114 covering two opposite surfaces of the core layer 110. In detail, the core layer 110 further includes a plurality of conductive via for conducting the third metal layer 112 and the fourth metal layer 114, and the conductive via may be formed by different ways. For example, a first through hole 140 penetrating the core layer 110 is firstly formed. Then, a first conductive layer 142 is formed by, for example, electroplating, wherein the first conductive layer 142 covers an inner wall of the first through hole 140 and connects the third metal layer 112 and the fourth metal layer 114. In addition, a second through hole 150 may also be formed. Then, a second conductive layer 152 is formed to comprehensively fill the second through hole 150 and connect the third metal layer 112 and the fourth metal layer 114. Furthermore, a third through hole 160 penetrating the core layer 110 may further be formed. Next, a third conductive layer 162 is formed to cover an inner wall of the third through hole 160 and connect the third metal layer 112 and the fourth metal layer 114. Then, a plugging ink 164 is filled in the third through hole 160. Of course, the present embodiment is merely for illustration, the invention does not limit the number of the conductive vias in the core layer 110 and the manufacturing method of the conductive vias.

Then, a patterning process is performed on the third metal layer 112 and the fourth metal layer 114 as shown in FIG. 1A to form a third patterned metal layer 112a and a fourth patterned metal layer 114a as shown in FIG. 1B. Next, a cavity 116 penetrating the core layer 110 as shown in FIG. 1C is formed and then the core layer 110 is disposed on a tape carrier 750 as shown in FIG. 1D, and the cavity 116 exposes a part of the tape carrier 750.

Referring to FIG. 1E, at least one semiconductor component 700 (two semiconductor components 700 are illustrated herein), is disposed on the part of the tape carrier 750 exposed by the cavity 116, such that the semiconductor component 700 is located in the cavity 116. In the present embodiment, the semiconductor component 700 may be an active component or a passive component. Or else, the number of the semiconductor components 700 may be plural, and the semiconductor components 700 may include an active component and a passive component. The invention does not limit the number and the type of the semiconductor component 700.

Referring to FIG. 1F, a first stacked layer 120 is laminated onto the core layer 110 along a direction toward the third patterned metal layer 112. The first stacked layer 120 includes a first dielectric layer 122 and a first metal layer 124. To be more specific, the first stacked layer 120 is laminated onto the core layer 110 with its own first dielectric layer 122, such that the first dielectric layer 122 covers at least a part of the core layer 110 and the semiconductor component 700. Moreover, in the present embodiment, the first dielectric layer 122 may further fill at least a part of the first through hole 140 as shown in FIG. 1F.

Then, the tape carrier 750 shown in FIG. 1F is removed to expose the fourth patterned metal layer 114a and form the structure shown in FIG. 1G. Next, a second stacked layer 130 is laminated on the core layer along a direction toward the fourth patterned metal layer 114a. The second stacked layer 130 includes a second dielectric layer 132 and a second metal layer 134. The second stacked layer 130 is laminated onto the core layer 110 with its own second dielectric layer 132, such that the second dielectric layer 132 and the first dielectric layer 122 jointly encapsulate the semiconductor component 700. Moreover, in the present embodiment, the second dielectric layer 132 may fill the part of the first through hole 140 not filled by the first dielectric layer 122. Namely, the first dielectric layer 122 may jointly fill the first through hole 140 with the second dielectric layer 132.

Then, referring to FIG. 1I, a plurality of component conducting vias 170 are formed. The component conducting vias 170 electrically connect the semiconductor component 700 to the first metal layer 124 or the second metal layer 134. In the present embodiment, the semiconductor conducting vias 170 electrically connect the semiconductor component 700 to the second metal layer 134 as shown in FIG. 1I. In addition, at the time the component conducting vias 170 are formed, a plurality of first conductive vias 144, a plurality of second conductive vias 154 and a plurality of third conductive vias 164 may also be formed. The first conductive vias 144 are configured for electrically connecting the first conductive layer 142 to the first metal layer 124 and the second metal layer 134. The second conductive vias 154 are configured for electrically connecting the second conductive layer 152 to the first metal layer 124 and the second metal layer 134. The third conductive vias 164 are configured for electrically connecting the third conductive layer 162 to the first metal layer 124 and the second metal layer 134.

In addition, referring to both FIG. 1I and FIG. 1J, in the present embodiment, a fourth through hole 180 penetrating the first stacked layer 120 and the second stacked layer 130 may further be formed. Then, a fourth conductive layer 182 is formed. The fourth conductive layer 182 covers an inner wall of the fourth through hole 180 as shown in FIG. 1I and connects the first metal layer 124 and the second metal layer 134. Next, a plugging ink 184 is filled in the fourth though hole 180, wherein the fourth conductive layer 182 electrically connect the first metal layer 124 and the second metal layer 134 to form a fourth conductive via. It is noted that the process of forming the fourth conductive via in the present embodiment may be simultaneously performed with the processes of forming the first conductive vias 144, the second conductive vias 154 and the third conductive vias 164, or performed separately. As such, the manufacturing process of the first substrate 100 may be firstly completed.

The first substrate 100 formed by the manufacturing process described above includes a first surface S1, a second surface S2 opposite to the first surface S1, the first metal layer 124 and the second metal layer 134 as shown in FIG. 1J. The first metal layer 124 and the second metal layer 134 are disposed on the first surface S1 and the second surface S2 respectively.

Next, a patterning process is performed on the first metal layer 124 and the second metal layer 134 to form a first patterned metal layer 124a and a second patterned metal layer 134a as shown in FIG. 1K, wherein the first patterned metal layer 124a and the second patterned metal layer 134a are electrically connected to the component conducting vias 170, the first conductive vias 144, the second conductive vias 154 and the third conductive vias 164.

Referring to FIG. 1L, a patterned solder mask 200 is formed on the first patterned metal layer 124a and the second patterned metal layer 134a, and the patterned solder mask 200 exposes at least a part of the first patterned metal layer 124a and the second patterned metal layer 134a.

Then, referring to FIG. 1M, a plurality of first thermal-conductive posts 300 are formed on the part of the first patterned metal layer 124a exposed by the patterned solder mask 200, and each of the first thermal-conductive posts 300 is thermally coupled to the first patterned metal layer 124a. It is noted that the locations of the first thermal-conductive posts 300 in the present embodiment are merely for illustration, and the invention is not limited thereto. Next, a surface finish layer 250 may be formed on the first patterned metal layer 124a or the second patterned metal layer 134a. The surface finish layer 250 covers the exposed part of the first patterned metal layer 124a and the second patterned metal layer 134a. In the present embodiment, the surface finish layer 250 includes an organic solderability preservatives (OSP) layer, an electroless nickel and immersion gold (ENIG) layer, an immersion silver (I-Ag) layer, an immersion tin (I-Sn) layer, an immersion bismuth (I-Bi) layer, a hot air solder levelling (HASL) layer, a nickel and gold electroplating layer, an electroless Pd/Ni layer, an electroless Pd/Cu layer or a SnBi layer. Of course, the present invention is not limited thereto.

Referring to FIG. 1O, a semiconductor component 400 is disposed on the first surface S1. The semiconductor component 400 is electrically connected to the first patterned metal layer 124a and thermally coupled to the first thermal-conductive posts 300. Next, a second substrate 500 is connected to the first substrate 100 through the first thermal-conductive posts. Two opposite ends of each of the first thermal-conductive posts 300 are connected to the first substrate 100 and the second substrate 500 respectively, such that the semiconductor component 400 is located between the first substrate 100 and the second substrate 500. Moreover, the first thermal-conductive posts 300 are thermally coupled to the second substrate 500. In the present embodiment, the semiconductor component 400 may be, for example, a chip. Of course, the invention does not limit the number and the type of the semiconductor component 400. As such, the manufacturing process of the package structure may be completed.

With the disposition described above, the present embodiment adopts the first thermal-conductive posts 300 to be connected between the first substrate 100 and the second substrate 500 to facilitate heat dissipation of the semiconductor component 700 embedded in the first substrate 100. In addition, the semiconductor 400, which is conventionally stacked on the first substrate 100, is disposed in the space between the first substrate 100 and the second substrate 500 defined by the first thermal-conductive posts 300, so as to improve the space utilization of the package structure 10 and reduce the overall thickness of the package structure 10.

In addition, in the present embodiment, a plurality of second thermal-conductive posts 600 may be formed on another side of the first substrate 100 as shown in FIG. 1P, and the second thermal-conductive posts 600 are located on the second patterned metal layer 134a exposed by the patterned solder mask 200, and each of the second thermal-conductive posts 600 are thermally coupled to the second patterned metal layer 134a. Of course, the locations of the second thermal-conductive posts 600 in the present embodiment are merely for illustration, and the invention is not limited thereto. Next, a semiconductor component 900 is disposed on the second surface S2 and the semiconductor component 900 is electrically connected to the second patterned metal layer 134a and is thermally coupled to the second thermal-conductive posts 600. Then, a third substrate 800 is connected to the first substrate through the second thermal-conductive posts 600. Two opposite ends of each of the second thermal-conductive posts 600 are connected to the first substrate 100 and the third substrate 800, such that the semiconductor component 900 is located between the first substrate 100 and the third substrate 800. Moreover, the second thermal-conductive posts 600 are thermally coupled to the third substrate 800. In the present embodiment, the semiconductor component 900 may be, for example, a chip. Of course, the invention does not limit the number and the type of the semiconductor component 900. As such, the manufacturing process of the package structure 10 may be completed.

Structure-wise, referring to FIG. 1O, the package structure 10 includes the first substrate 100, the patterned solder mask 200, the first thermal-conductive posts 300, first semiconductor component 400 and the second substrate 500. The first substrate 100 includes the first patterned metal layer 124a, the second patterned metal layer 134a, the first surface S1 and the second surface S2 opposite to the first surface S1. The first patterned metal layer 124a and the second patterned metal layer 134a are disposed on the first surface s1 and the second surface S2 respectively. The patterned solder mask 200 is disposed on the first patterned metal layer 124a and the second patterned metal layer 134a, and exposes at least a part of the first patterned metal layer 124a and the second patterned metal layer 134a. The first thermal-conductive posts 300 are disposed on the exposed part of the first patterned metal layer 124a and thermally coupled to the first patterned metal layer 124a. The first semiconductor component 400 is disposed on the first surface S1. The first semiconductor component 400 is electrically connected to the first patterned metal layer 124a and thermally coupled to the first thermal-conductive posts 300. Two opposite ends of each of the first thermal-conductive posts 300 are connected to the first substrate 100 and the second substrate 500 respectively, such that the first semiconductor component 400 is located between the first substrate 100 and the second substrate 500, and the first thermal-conductive posts 300 are thermally coupled to the second substrate 500.

In addition, referring to FIG. 1P, the package structure of the present embodiment may further includes the second thermal-conductive posts 600, the second semiconductor component 900 and the third substrate 800, wherein the second thermal-conductive posts 600 are disposed on the second patterned metal layer 134a exposed by the patterned solder mask 200 and thermally coupled to the second patterned metal layer 134a. The second semiconductor component 900 is disposed on the second surface S2. The second semiconductor component 900 is electrically connected to the second patterned metal layer 134a and thermally coupled to the second thermal-conductive posts 600. Two opposite ends of each of the second thermal-conductive posts 600 are connected to the first substrate 100 and the third substrate 800 respectively, so as to connect the third substrate 800 to the first substrate 100. The second semiconductor component 900 is located between the first substrate 100 and the third substrate 800, and the second thermal-conductive posts 600 are thermally coupled to the third substrate 800.

Furthermore, in the present embodiment, at least one semiconductor component 700 may further be embedded in the first substrate 100. In detail, the first substrate 100 may further includes the core layer 110, the semiconductor component 700, the first stacked layer 120, the second stacked layer 130 and the component conducting vias 170. The core layer 110 includes the cavity 116 penetrating the core layer 110, the third patterned metal layer 112a and the fourth patterned metal layer 114a. The third and the fourth patterned metal layers 112a, 114a cover two opposite surfaces of the core layer 110 respectively. The semiconductor component 700 is disposed in the cavity. The first and the second stacked layers 120, 130 are disposed on two opposite surfaces of the core layers 110 respectively. The first stacked layer 120 includes the first dielectric layer 122 and the first patterned metal layer 124. The second stacked layer 130 includes the second dielectric layer 132 and the second patterned metal layer 134. The first dielectric layer 122 and the second dielectric layer 132 jointly encapsulate the third semiconductor component 700 and the core layer 110. The component conducting vias 170 are electrically connected to the third semiconductor component 700 to the first patterned metal layer 124 or the second patterned metal layer 134.

In addition, the package structure of the present embodiment may further includes the first conductive vias 144, the second conductive vias 154 and the third conductive vias 164, wherein the first conductive vias 144 electrically connect the first conductive layer 142 to the first metal layer 124 and the second metal layer 134. The second conductive vias 154 electrically connect the second conductive layer 152 to the first metal layer 124 and the second metal layer 134 respectively, and the third conductive vias 164 electrically connect the third conductive layer 162 to the first metal layer 124 and the second metal layer 134.

In sum, the present invention adopts a plurality of thermal-conductive posts to connect the first substrate and the second substrate. As such, the thermal-conductive posts can facilitate the heat dissipation of the semiconductor component embedded in the first substrate. Moreover, another semiconductor component, which is conventionally stacked on the first substrate, can now be disposed in the space between the first substrate and the second substrate defined by the thermal-conductive posts, so as to improve space utilization of the package structure, and further reduce the overall thickness of the package structure. Moreover, the thermal-conductive posts may also be thermally coupled to the semiconductor component disposed between the first substrate and the second substrate, so as to perform heat dissipation for the semiconductor component.

Similarly, in the present invention, a plurality of thermal-conductive posts are formed on two opposite sides of the first substrate, such that the second substrate and the third substrate can be connected to the first substrate through the thermal-conductive posts on each sides of the first substrate. Then, a plurality of semiconductor components may be respectively disposed between the first substrate and the second substrate and between the first substrate and the third substrate, so as to improve the heat dissipation efficiency and space utilization of the package structure and further reduce the overall thickness of the package structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
    a first substrate,. comprising:
        a core layer comprising a first surface and a second surface, a cavity, a third patterned metal layer and a fourth patterned metal layer, the third patterned metal layer and the fourth patterned metal layer covering two opposite surfaces of the core layer respectively, and the cavity penetrating the core layer;
        a third semiconductor component disposed in the cavity;
        a first stacked layer and a second stacked layer disposed on the two opposite surfaces of the core layer respectively, the first stacked layer comprising a first dielectric layer and a first patterned metal layer, the second stacked layer comprising a second dielectric layer and a second patterned metal layer, and the first dielectric layer and the second dielectric layer jointly encapsulating the third semiconductor component and the core layer; and
        a plurality of component conducting vias for electrically connecting the third semiconductor component to the first patterned metal layer and the second patterned metal layer;
    a patterned solder mask disposed on the first patterned metal layer and the second patterned metal layer and exposing at least a part of the first patterned metal layer and the second patterned metal layer;
    a plurality of first posts disposed on the exposed part of the first patterned metal layer and thermally coupled to the first patterned metal layer;
    a first semiconductor component disposed on the first surface, and the first semiconductor component electrically connecting the first patterned metal layer and thermally coupled to the first posts; and
    a second substrate, wherein two opposite ends of each of the first posts are connected to the first substrate and the second substrate respectively, such that the first semiconductor component is located between the first substrate and the second substrate and the first posts are thermally coupled to the second substrate.

2. The package structure as claimed in claim 1, further comprising:
    a plurality of second posts disposed on the exposed part of the second patterned metal layer and thermally coupled to the second patterned metal layer;
    a second semiconductor component disposed on the second surface, and the second semiconductor component electrically connecting the second patterned metal layer and thermally coupled to the second posts; and
    a third substrate, wherein two opposite ends of each of the second posts are connected to the first substrate and the third substrate respectively, such that the second semiconductor component is located between the first substrate and the third substrate and the second posts are thermally coupled to the third substrate.

3. The package structure as claimed in claim 1, wherein the first substrate further comprises:
    a first through hole penetrating through the core layer; and
    a first conductive layer covering an inner wall of the first through hole and connecting the third metal layer and the fourth metal layer.

4. The package structure as claimed in claim 3, wherein the first dielectric layer and the second dielectric layer are filled in the first through hole.

5. The package structure as claimed in claim 3, wherein the first substrate further comprises:
    a plurality of first conductive vias electrically connecting the first conductive layer to the first metal layer and the second metal layer.

6. The package structure as claimed in claim 1, wherein the first substrate further comprises:
    a second substrate penetrating the core layer; and
    a second conductive layer comprehensively filling in the second through hole and connecting the third metal layer and the fourth metal layer.

7. The package structure as claimed in claim 6, wherein the first substrate further comprises:
    a plurality of second conductive vias electrically connecting the second conductive layer to the first metal layer and the second metal layer.

8. The package structure as claimed in claim 1, wherein the first substrate further comprises:
    a third through hole penetrating the core layer;
    a third conductive layer covering an inner wall of the first through hole and connecting the third metal layer and the fourth metal layer; and
    a plugging ink filling in the third through hole.

9. The package structure as claimed in claim 8, wherein the first substrate further comprises:

a plurality of third conductive vias electrically connecting the third conductive layer to the first metal layer and the second metal layer.

10. The package structure as claimed in claim 1, wherein the first substrate further comprises:
    a fourth through hole penetrating the first stacked layer and the second stacked layer;
    a fourth conductive layer covering an inner wall of the fourth through hole and connecting the first metal layer and the second metal layer; and
    a plugging ink filling in the fourth through hole.

11. The package structure as claimed in claim 1, further comprising:
    a surface finish layer disposed on the first patterned metal layer and the second patterned metal layer, and the surface finish layer covering the part of the first patterned metal layer and the second patterned metal layer exposed by the patterned solder mask.

12. The package structure as claimed in claim 11, wherein the surface finish layer comprises an organic solderability preservatives layer, an electroless nickel and an immersion gold layer, an immersion silver layer, an immersion tin layer, an immersion bismuth layer, a hot air solder levelling layer, a nickel and gold electroplating layer, an electroless Pd/Ni layer, an electroless Pd/Cu layer or a SnBi layer.

13. The package structure as claimed in claim 11, wherein the at least one third semiconductor component comprises an active component and/or a passive component.

\* \* \* \* \*